(12) United States Patent
Chung et al.

(10) Patent No.: US 9,502,758 B2
(45) Date of Patent: Nov. 22, 2016

(54) ELECTRONIC PACKAGE AND FABRICATION METHOD THEREOF

(71) Applicant: Siliconware Precision Industries Co., Ltd, Taichung (TW)

(72) Inventors: Hsin-Lung Chung, Taichung (TW);
Hao-Ju Fang, Taichung (TW);
Chih-Hsien Chiu, Taichung (TW);
Yude Chu, Taichung (TW);
Tsung-Hsien Tsai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 241 days.

(21) Appl. No.: 14/146,163

(22) Filed: Jan. 2, 2014

(65) Prior Publication Data
US 2015/0145747 A1 May 28, 2015

(30) Foreign Application Priority Data
Nov. 28, 2013 (TW) .............................. 102143399 A

(51) Int. Cl.
*H01Q 1/40* (2006.01)
*H01Q 9/42* (2006.01)
*H01Q 23/00* (2006.01)

(52) U.S. Cl.
CPC .................. *H01Q 1/40* (2013.01); *H01Q 9/42* (2013.01); *H01Q 23/00* (2013.01)

(58) Field of Classification Search
CPC .......... H01Q 1/40; H01Q 9/42; H01Q 23/00; H01Q 1/2283
USPC .................................................. 343/873, 702
See application file for complete search history.

(56) References Cited

U.S. PATENT DOCUMENTS

| | | | |
|---|---|---|---|
| 7,504,721 B2* | 3/2009 | Chen .................. | H01L 25/16 257/691 |
| 7,564,359 B2* | 7/2009 | Koh .................... | G06K 19/0723 235/492 |
| 7,586,193 B2* | 9/2009 | Weste .................. | H01L 23/48 257/678 |
| 8,786,060 B2* | 7/2014 | Yen ..................... | H01L 21/50 257/660 |

\* cited by examiner

*Primary Examiner* — Hoang V Nguyen
(74) *Attorney, Agent, or Firm* — Mintz Levin Cohn Ferris Glovsky and Popeo, P.C.; Peter F. Corless; Steven M. Jensen

(57) ABSTRACT

An electronic package is disclosed, which includes: a substrate; at least an electronic element disposed on the substrate; an encapsulant formed on the substrate and encapsulating the electronic element; and an antenna body embedded in the encapsulant without contacting with the substrate and exposed from a surface of the encapsulant. Since the antenna body is not disposed on the substrate, the surface area of the substrate can be reduced to meet the miniaturization requirement of the electronic package.

24 Claims, 6 Drawing Sheets

ELECTRONIC PACKAGE AND FABRICATION METHOD THEREOF

CROSS-REFERENCES TO RELATED APPLICATIONS

This application claims under 35 U.S.C. §119(a) the benefit of Taiwanese Application No. 102143399, filed Nov. 28, 2013, the entire contents of which is incorporated herein by reference.

BACKGROUND OF THE INVENTION

1. Field of the Invention

The present invention relates to electronic packages, and more particularly, to an electronic package having an antenna structure.

2. Description of Related Art

Along with the rapid development of electronic industries, electronic products are developed toward the trend of multi-function and high performance. Wireless communication technologies have been widely applied in various kinds of consumer electronic products for receiving or transmitting various wireless signals. To meet the miniaturization requirement of consumer electronic products, wireless communication modules are becoming lighter, thinner, shorter and smaller. For example, patch antennas have been widely applied in wireless communication modules of electronic products such as cell phones and personal digital assistants (PDAs) due to their advantages of small size, light weight and easy fabrication.

FIG. 1 is a schematic perspective view of a conventional wireless communication module. Referring to FIG. 1, the wireless communication module 1 has: a substrate 10, a plurality of electronic elements 11 disposed on and electrically connected to the substrate 10, an antenna structure 12 disposed on the substrate 10, and an encapsulant 13. The substrate 10 is a circuit board and has a rectangular shape. The antenna structure 12 is of a planar type. The antenna structure 12 has an antenna body 120 and a conductive wire 121 electrically connecting the antenna body 120 to the electronic elements 11. The encapsulant 13 encapsulates the electronic elements 11 and a portion of the conductive wire 121.

However, during the fabrication process of the wireless communication module 1, based on the characteristic of electromagnetic radiation between the planar-type antenna structure 12 and the electronic elements 11 and limitation of the size of the planar-type antenna structure 12, the antenna body 120 of the antenna structure 12 cannot be integrally processed with the electronic elements 11. That is, only the electronic elements 11 are covered by the encapsulant 13 while the antenna body 120 of the antenna structure 12 is exposed from the encapsulant 13. Therefore, the molding process for forming the encapsulant 13 needs to use a mold having a size corresponding to the mounting area of the electronic elements 11 instead of the overall substrate 10, thus complicating the molding process.

Further, the planar-type antenna structure 12 occupies a large surface area of the substrate 10 and hinders miniaturization of the wireless communication module 1.

Therefore, there is a need to provide an electronic package and a fabrication method thereof so as to overcome the above-described drawbacks.

SUMMARY OF THE INVENTION

In view of the above-described drawbacks, the present invention provides an electronic package, which comprises: a substrate; at least an electronic element disposed on the substrate; an encapsulant formed on the substrate and encapsulating the electronic element; and an antenna body embedded in the encapsulant without contacting with the substrate and exposed from a surface of the encapsulant.

The present invention further provides a method for fabricating an electronic package, which comprises the steps of: providing a substrate defined with an active area and a non-active area, wherein the active area has at least an electronic element disposed thereon; disposing an antenna structure on the substrate, wherein the antenna structure has an antenna body and a support portion connected to the antenna body for supporting the antenna body over the active area of the substrate, and the support portion is located on the non-active area of the substrate; forming an encapsulant on the active area of the substrate for encapsulating the electronic element and the antenna body; and removing the non-active area of the substrate and the support portion on the non-active area so as to expose a surface of the antenna body from a surface of the encapsulant.

In the above-described method, the encapsulant can further be formed on the non-active area of the substrate for encapsulating the support portion, and when removing the non-active area of the substrate, the encapsulant on the non-active area of the substrate is accordingly removed.

In the above-described package and method, the substrate can have a plurality of circuits electrically connected to the electronic element, and the substrate can be electrically connected to the antenna body, for example, through at least a bonding wire.

In the above-described package and method, the electronic element can be an active element or a passive element.

In the above-described package and method, the antenna body can be a metal frame. The antenna body can be such as a linear-shaped body, a bent-shaped body, a ring-shaped body or a ring-shaped body having an opening.

In the above-described package and method, the antenna body can be located over an edge of the substrate and surround the electronic element. The exposed surface of the antenna body can be flush with the surface of the encapsulant.

In the above-described package and method, at least a support portion can be located on the active area of the substrate and encapsulated by the encapsulant. Therein, the support portion on the active area is not removed when the non-active area of the substrate is removed. Further, the support portion on the active area of the substrate can be electrically connected to the substrate.

According to the present invention, since the antenna body is located over the substrate, both the antenna body and the electronic element can be encapsulated by the encapsulant. As such, the present invention can use a mold having a size corresponding to the substrate so as to facilitate the molding process for forming the encapsulant.

Further, since the antenna body is supported over a region of the substrate where the electronic element is disposed (i.e., where the encapsulant is to be formed, for example, the active area) instead of being directly disposed on the substrate, the invention saves the surface area of the substrate. Therefore, compared with the prior art, the invention can effectively reduce the size of the substrate so as to meet the miniaturization requirement of the electronic package.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "lower", "first", "second", "a" etc. are merely for illustrative purposes and should not be construed to limit the scope of the present invention.

Figure 1:
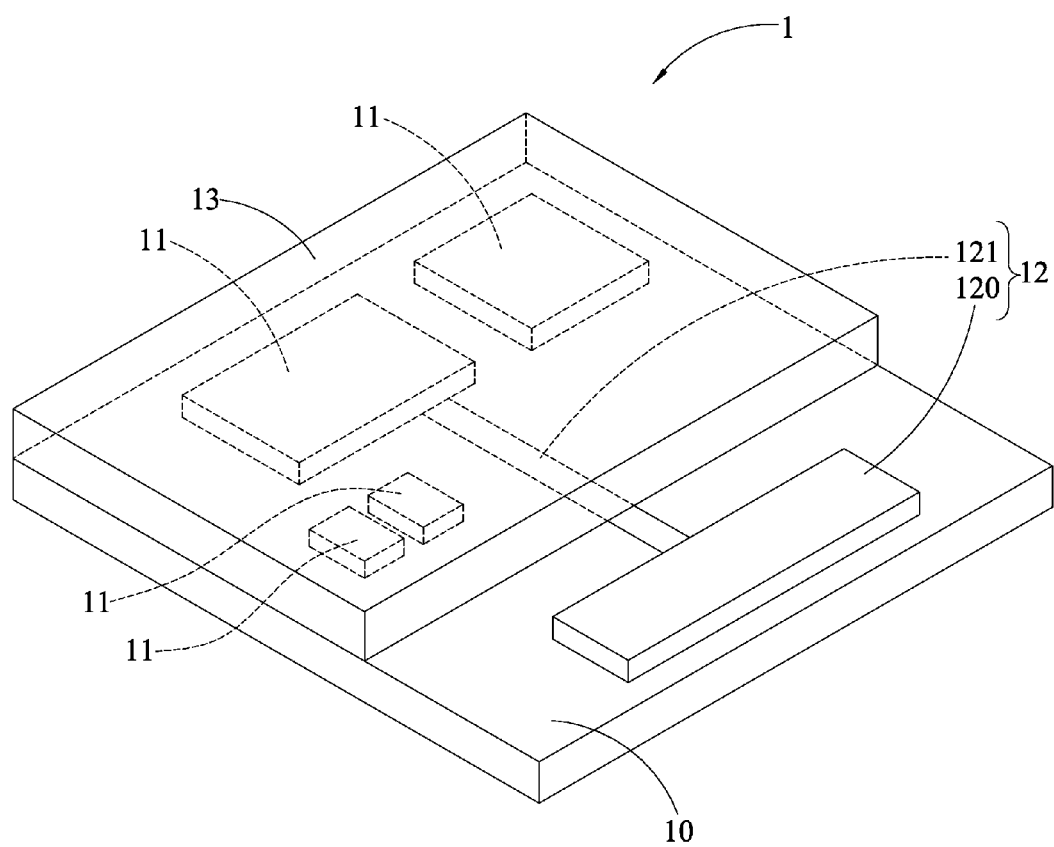
FIG. 1 is a schematic perspective view of a conventional wireless communication module.
Figure 2A:
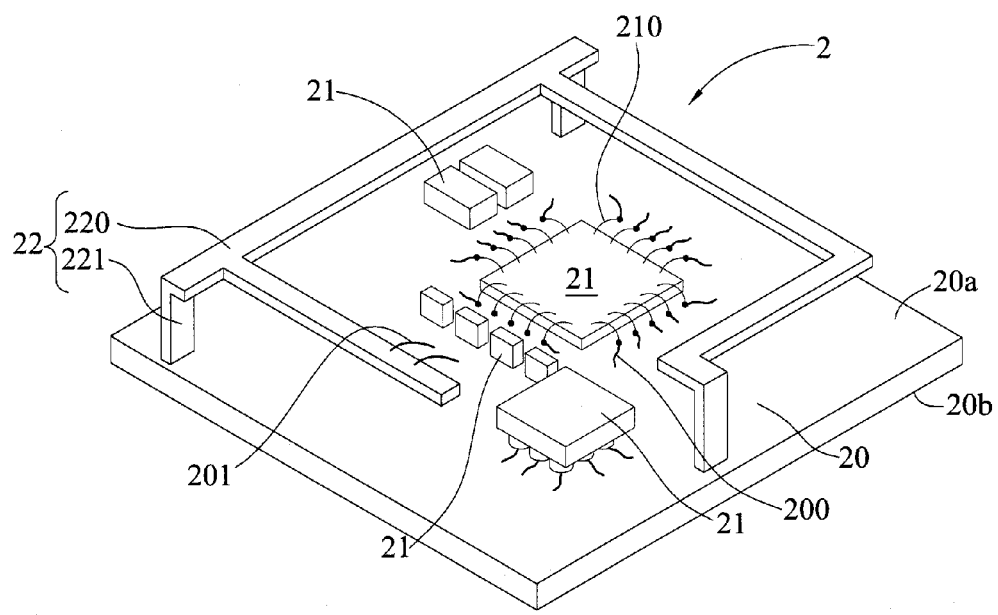
FIGS. 2A to 2C are schematic perspective views showing a method for fabricating an electronic package according to a first embodiment of the present invention, wherein FIG. 2A' is a schematic cross-sectional view of FIG. 2A, and FIG. 2C' is a partially cross-sectional view of FIG. 2C.
Figure 2A:
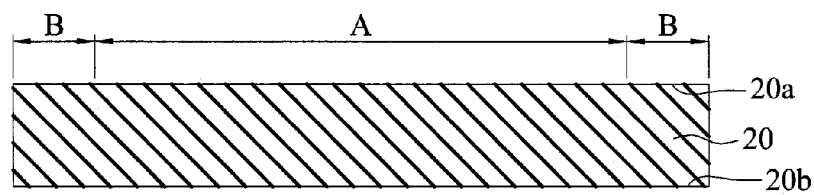
Figure 2B:
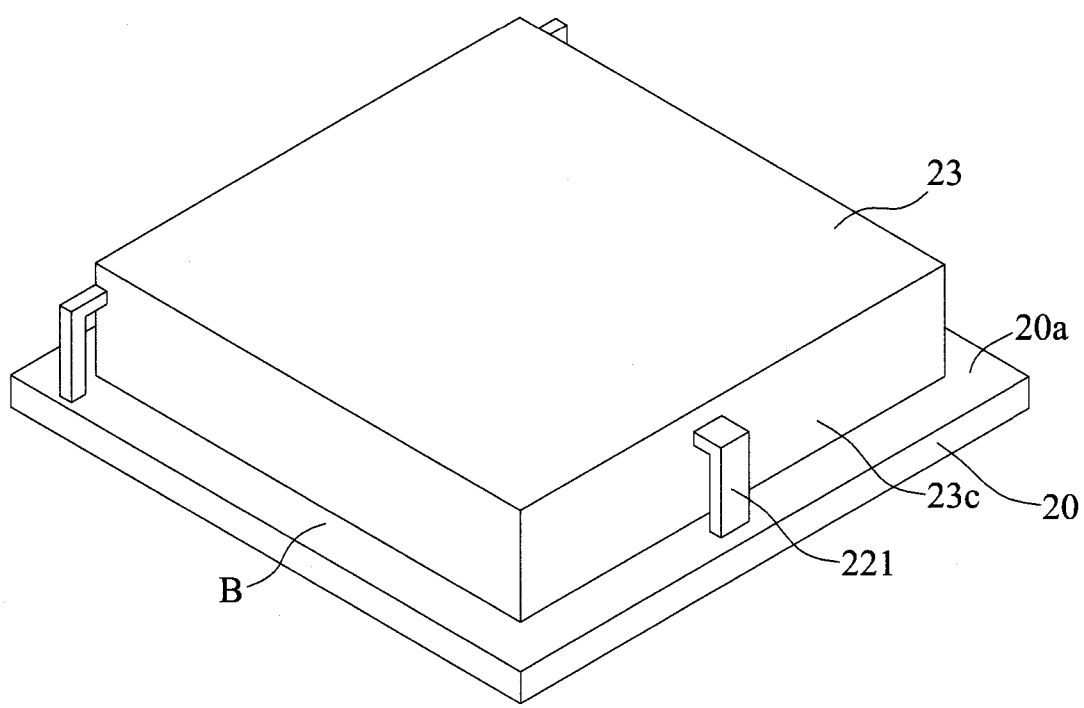
Figure 2C:
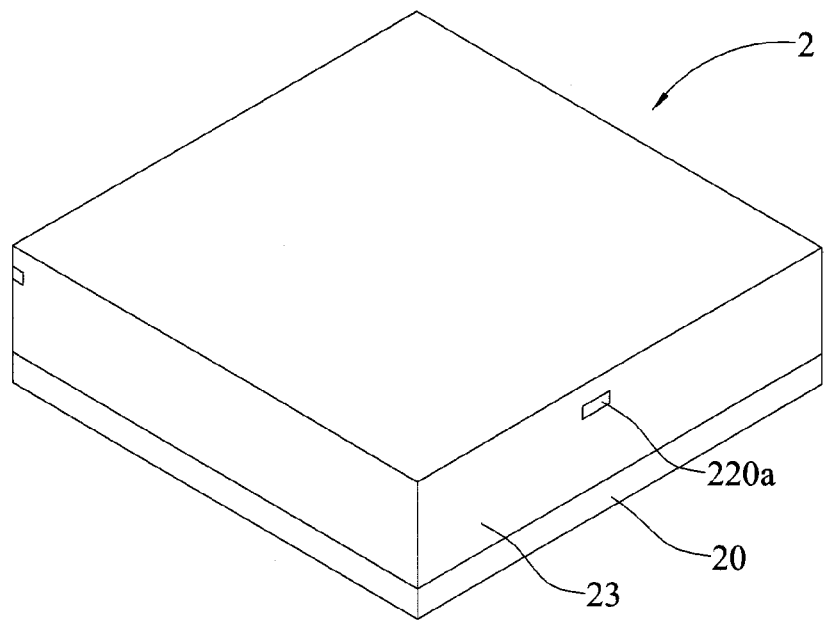
Figure 2C:
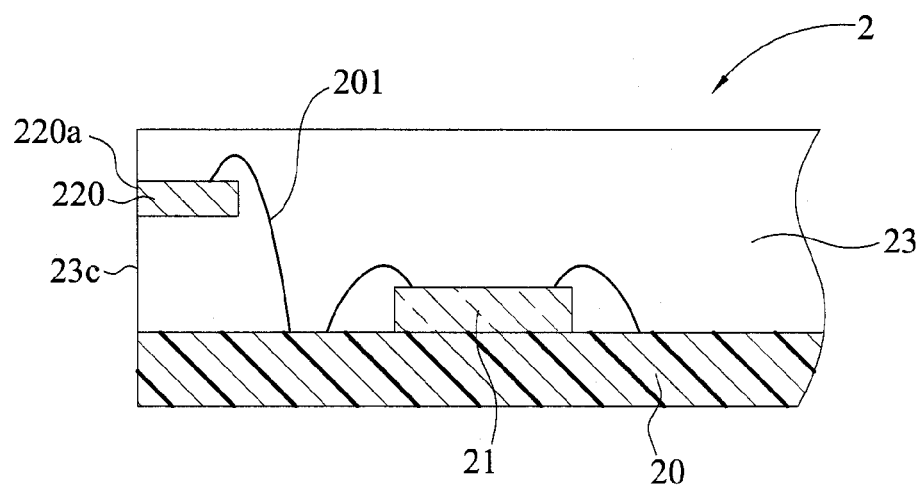

FIGS. 2A to 2C are schematic perspective views showing a method for fabricating an electronic package 2 according to a first embodiment of the present invention. In the present embodiment, the electronic package 2 is a SiP (system in package) wireless communication module.

Referring to FIGS. 2A and 2A', a substrate 20 having opposite first and second surfaces 20a, 20b is provided. The first surface 20a of the substrate 20 is defined with a rectangular-shaped active area A and a non-active area B around an outer periphery of the active area A, and a plurality of electronic elements 21 are disposed on the active area A. Then, an antenna structure 22 is disposed on the first surface 20 of the substrate 20.

In the present embodiment, the substrate 20 is a circuit board or a ceramic board and has a rectangular shape. A plurality of circuits 200 are formed on the first surface of the substrate 20. Further, a circuit layer (not shown) can be formed inside the substrate 20.

The electronic elements 21 can be active or passive elements. The electronic elements 21 are electrically connected to the circuits 200 through a plurality of bonding wires 210.

Further, the antenna structure 22 is a metal frame. The antenna structure 22 has an antenna body 220, and a plurality of bent-shaped support portions 221 vertically disposed on the non-active area B of the substrate 20 for supporting the antenna body 220 over the active area A of the substrate 20. As such, the antenna body 220 of the antenna structure 22 is located at a position higher than the electronic elements 21. In particular, the antenna body 220 is located over side edges of the active area A of the substrate 20 and correspondingly extends to surround the electronic elements 21.

Furthermore, the substrate 20 is electrically connected to the antenna body 220 of the antenna structure 22 through, for example, at least a bonding wire 201. The antenna body 220, 220' can be a ring-shaped body having an opening, for example, a substantially C-shaped body of FIG. 2A or a substantially n-shaped body of FIGS. 3A and 3A'. In other embodiments, the antenna body 220 can be a linear-shaped body, such as an I-shaped body, a bent-shaped body, such as an L-shaped body, or a ring-shaped body, such as a rectangular-shaped body.

Referring to FIG. 2B, an encapsulant 23 is formed on the active area A of the first surface 20a of the substrate 20 to encapsulate the electronic elements 21 and the antenna body 220 of the antenna structure 22.

In the present embodiment, the antenna body 220 is buried adjacent to an upper side of the encapsulant 23 and the support portions 221 protrude from side surfaces 23c of the encapsulant 23.

Referring to FIGS. 2C and 2C', a cutting process is performed to remove the non-active area B of the substrate 20 and the support portions 221 on the non-active area B, thereby exposing surfaces 220a of the antenna body 220 (i.e., interfaces between the support portions 221 and the antenna body 220) from the side surfaces 23c of the encapsulant 23. The antenna body 220 does not contact with the first surface 20a or the second surface 20b of the substrate 20. In the present embodiment, the exposed surfaces 220a of the antenna body 220 are flush with the side surfaces 23c of the encapsulant 23.

In other embodiments, the encapsulant 23 can further be formed on the non-active area B for encapsulating the support portions 221. As such, when the non-active area B of the substrate 20 is removed, the encapsulant 23 on the non-active area B is also removed.

According to the method of the present invention, a metal sheet is formed into the 3D antenna structure 22 and then the antenna body 220 of the antenna structure 22 is disposed over the substrate 20 to surround the electronic elements 21. As such, the antenna body 220 and the electronic elements 21 can be integrally processed. That is, both the antenna body 220 and the electronic elements 21 can be encapsulated by the encapsulant 23. Therefore, the present invention can use a mold having a size corresponding to the substrate 20 so as to facilitate the molding process for forming the encapsulant 23.

Further, the antenna body 220 can be stably fixed at a certain height by the encapsulant 23 even after the support portions 221 are removed. Furthermore, the dielectric constant of the encapsulant 23 can reduce the required electrical length of the antenna structure.

Moreover, since the antenna body 220 is supported over a region of the substrate 20 where the electronic elements 21 are disposed (i.e., the active area A) instead of being directly disposed on the substrate 20 as in the prior art, the present invention saves the surface area of the substrate 20. Therefore, compared with the prior art, the present invention can effectively reduce the size of the substrate 20 so as to meet the miniaturization requirement of the electronic package 2.

Also, by disposing the antenna body 220 over the substrate 20, a receiving space is formed between the antenna body 220 and the substrate 20, which can receive other electrical structures therein.

Figure 3A:
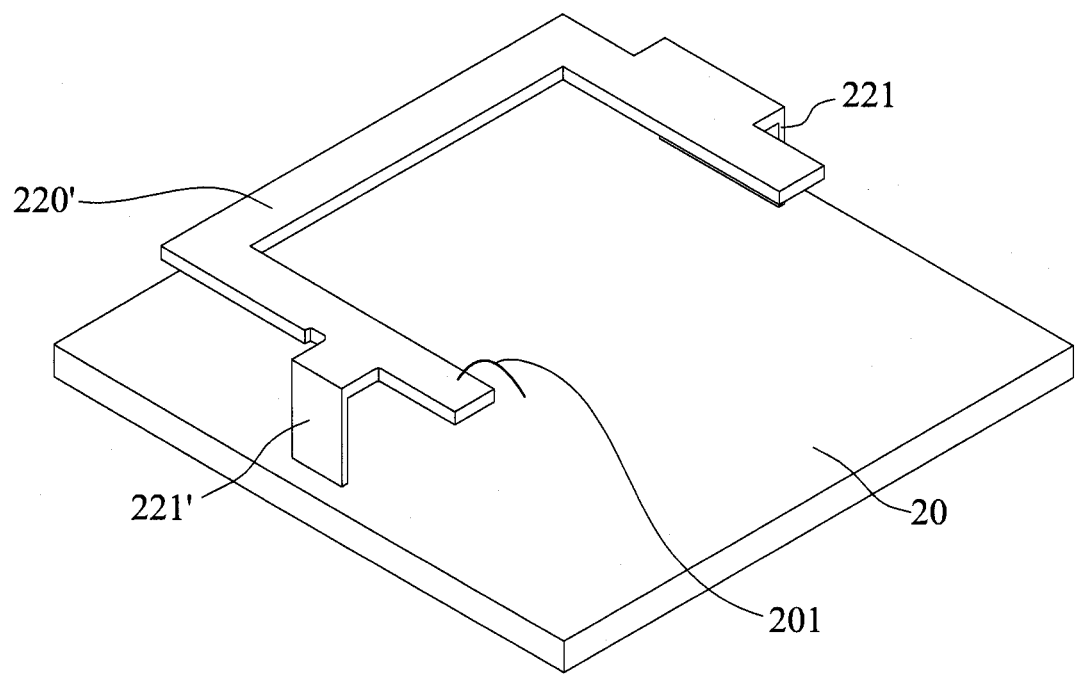
FIGS. 3A and 3B are schematic perspective and cross-sectional views showing a method for fabricating an electronic package according to a second embodiment of the present invention, wherein FIGS. 3A and 3A' show different embodiments of FIG. 2A, with the electronic elements omitted.
Figure 3A:
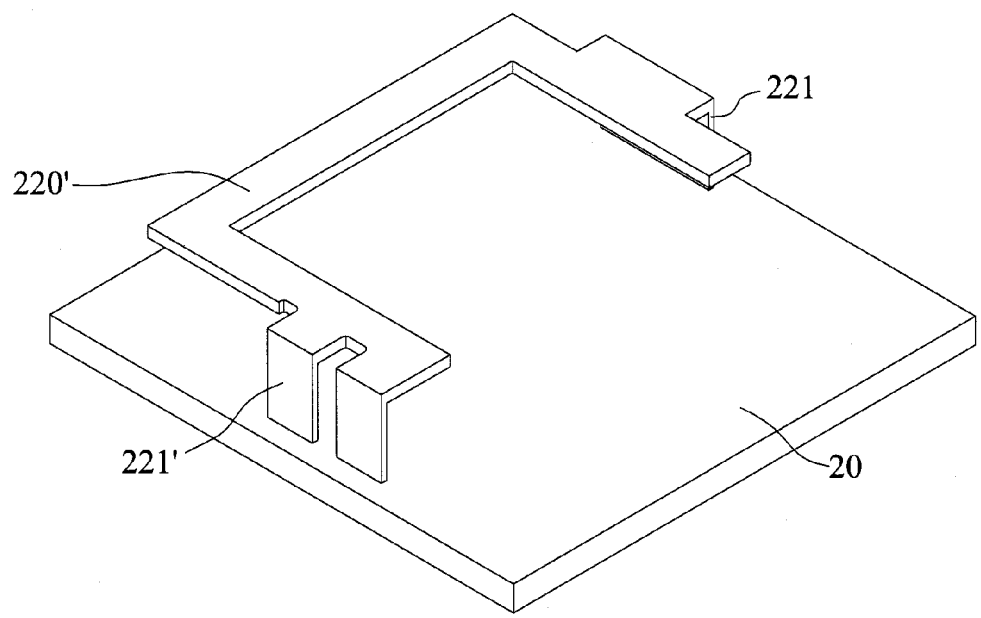
Figure 3B:
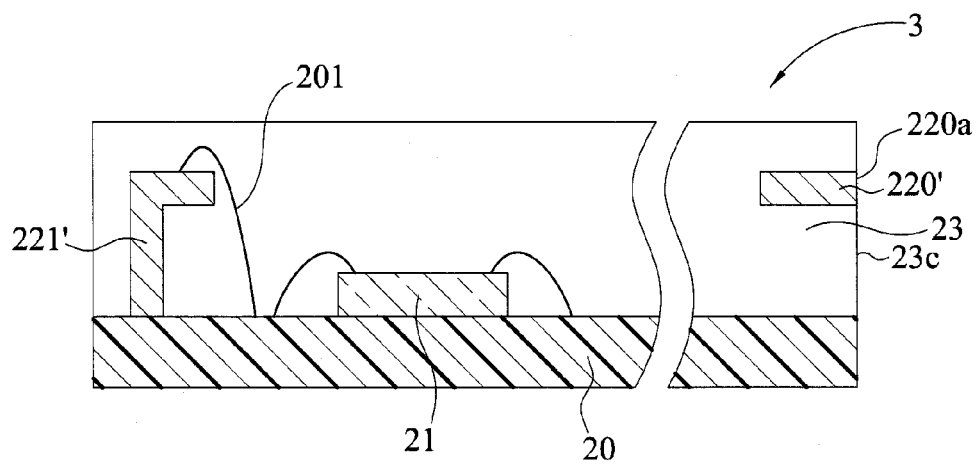

FIGS. 3A and 3B show a method for fabricating an electronic package 3 according to a second embodiment of the present invention.

Referring to FIGS. 3A and 3A', the antenna structure 22 has an antenna body 220' and a plurality of support portions 221, 221' connected to the antenna body 200'. The support portions 221 are vertically disposed on the non-active area B of the substrate 20, and the support portions 221' are vertically disposed on the active area A of the substrate 20.

The substrate 20 can be electrically connected (for example, grounded) to the antenna body 220' through the support portions 221'. Alternatively, the substrate 20 can be electrically connected to the antenna body 220' through a plurality of bonding wires 201. In other embodiments, the support portions 221' can be used only for supporting the antenna body 220' and have no electrical function.

Referring to FIG. 3B, an encapsulant 23 is formed on the active area A of the first surface 20a of the substrate 20 for encapsulating the electronic elements 21, the antenna body 220' and the support portions 221'.

Then, a cutting process is performed to remove the non-active area B and the support portions 221 thereon such that surfaces 220a of the antenna body 220' are exposed from side surfaces 23c of the encapsulant 23 while the support portions 221' are not exposed from the encapsulant 23.

According to the method of the present embodiment, the support portions 221' facilitate to stably fix the antenna body 220' at a certain height.

The invention further provides an electronic package 2, which has: a substrate 20, at least an electronic element 21 disposed on the substrate 20, an encapsulant 23 formed on the substrate 20 and encapsulating the electronic element 21, and an antenna body 220, 220' embedded in the encapsulant 23 without contacting with the substrate 20 and exposed from side surfaces 23c of the encapsulant 23.

The substrate 20 can have a plurality of circuits 200. The electronic element 21 can be an active element or a passive element and electrically connected to the circuits 200.

The antenna body 220, 220' can be a metal frame. The antenna body 220, 220' can be a ring-shaped body having an opening, a linear-shaped body, a bent-shaped body or a ring-shaped body.

In an embodiment, the circuits 200 or an inner circuit layer of the substrate 200 is electrically connected to the antenna body 220, 220' through at least a bonding wire 201.

In an embodiment, the exposed surfaces 220a of the antenna body 220 are flush with the side surfaces 23c of the encapsulant 23.

In an embodiment, the antenna body 220, 220' is located over side edges of the substrate 20 and correspondingly extends to surround the electronic elements 21.

In an embodiment, the electronic package 3 further has at least a support portion 221' connected to the antenna body 220', vertically disposed on the substrate 20 and embedded in the encapsulant 23. Further, the support portion 221' can be electrically connected to the substrate 20.

Therefore, by providing an antenna body that can be supported over a region of the substrate where the electronic elements are disposed, the present invention dispenses with the conventional planar-type antenna structure to facilitate the molding process and reduce the size of the substrate to meet the miniaturization requirement of the electronic package.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An electronic package, comprising:
    a substrate;
    at least an electronic element disposed on the substrate;
    an encapsulant formed on the substrate and encapsulating the electronic element; and
    an antenna body embedded in the encapsulant without contacting with the substrate, a surface of the antenna body being exposed from a surface of the encapsulant, wherein the substrate is electrically connected to the antenna body.

2. The package of claim 1, wherein the substrate has a plurality of circuits electrically connected to the electronic element.

3. The package of claim 1, wherein the substrate is electrically connected to the antenna body through at least a bonding wire.

4. The package of claim 1, wherein the electronic element is an active element or a passive element.

5. The package of claim 1, wherein the antenna body is a metal frame.

6. The package of claim 1, wherein the antenna body is a linear-shaped body, a bent-shaped body, a ring-shaped body or a ring-shaped body having an opening.

7. The package of claim 1, wherein the antenna body surrounds the electronic element.

8. The package of claim 1, wherein the exposed surface of the antenna body is flush with the surface of the encapsulant.

9. The package of claim 1, wherein the antenna body is located over an edge of the substrate.

10. The package of claim 1, further comprising at least a support portion connected to the antenna body, vertically disposed on the substrate and embedded in the encapsulant.

11. The package of claim 10, wherein the support portion is electrically connected to the substrate.

12. A method for fabricating an electronic package, comprising the steps of:
    providing a substrate defined with an active area and a non-active area, wherein the active area has at least an electronic element disposed thereon;
    disposing an antenna structure on the substrate, wherein the antenna structure has an antenna body and at least a support portion connected to the antenna body for supporting the antenna body over the active area of the substrate, and the support portion is located on the non-active area of the substrate;
    forming an encapsulant on the active area of the substrate for encapsulating the electronic element and the antenna body; and
    removing the non-active area of the substrate and the support portion on the non-active area so as to expose a surface of the antenna body from a surface of the encapsulant.

13. The method of claim 12, wherein the substrate has a plurality of circuits electrically connected to the electronic element.

14. The method of claim 12, wherein the substrate is electrically connected to the antenna body.

15. The method of claim 14, wherein the substrate is electrically connected to the antenna body through at least a bonding wire.

16. The method of claim 12, wherein the electronic element is an active element or a passive element.

17. The method of claim 12, wherein the antenna body is a metal frame.

18. The method of claim 12, wherein the antenna body is a linear-shaped body, a bent-shaped body, a ring-shaped body or a ring-shaped body having an opening.

19. The method of claim 12, wherein the antenna body surrounds the electronic element.

20. The method of claim 12, wherein the exposed surface of the antenna body is flush with the surface of the encapsulant.

21. The method of claim 12, wherein the antenna body is located over an edge of the substrate.

22. The method of claim 12, wherein the antenna structure further has at least a support portion located on the active area of the substrate and encapsulated by the encapsulant, and the support portion is not removed when the non-active area is removed.

23. The method of claim 22, wherein the support portion located on the active area of the substrate is electrically connected to the substrate.

24. The method of claim 12, wherein the encapsulant is further formed on the non-active area of the substrate for encapsulating the support portion, and when removing the non-active area of the substrate, the encapsulant on the non-active area of the substrate is accordingly removed.

\* \* \* \* \*